United States Patent [19]
Kovalcik et al.

[11] Patent Number: 5,212,456
[45] Date of Patent: May 18, 1993

[54] WIDE-DYNAMIC-RANGE AMPLIFIER WITH A CHARGE-PUMP LOAD AND ENERGIZING CIRCUIT

[75] Inventors: Thomas J. Kovalcik, Barrington; Paul W. Latham, II, Durham, both of N.H.

[73] Assignee: Allegro Microsystems, Inc., Worcester, Mass.

[21] Appl. No.: 753,483

[22] Filed: Sep. 3, 1991

[51] Int. Cl.$^5$ .............................................. H03F 3/45
[52] U.S. Cl. .................................... 330/261; 330/253; 330/257; 307/296.2
[58] Field of Search ............... 330/261, 307, 253, 257; 307/296.2, 303.2

[56] References Cited

U.S. PATENT DOCUMENTS

| | | | |
|---|---|---|---|
| 4,425,550 | 1/1984 | Smith et al. | 330/107 |
| 4,581,546 | 4/1986 | Allan | 307/296.2 |
| 4,591,738 | 5/1986 | Bailas, Jr. et al. | 307/296 R |
| 4,871,979 | 10/1989 | Shearer et al. | 330/257 |
| 5,003,197 | 3/1991 | Nojima et al. | 307/296.2 |
| 5,059,815 | 10/1991 | Bill et al. | 307/296.2 |

OTHER PUBLICATIONS

A. B. Grebene, "Bipolar and MOS Analog Integrated Circuit Design", Text Book, 1984, John Wiley & Sons, pp. 514–517.
J. B. Boyd et al., "Low Voltage, Low Cost, High Speed Charge Pump with High/Low Gain Operations," IBM Technical Disclosure Bulletin, vol. 28, No. 2, Jul. 1985, pp. 900–901.

*Primary Examiner*—Paul M. Dzierzynski
*Assistant Examiner*—Tan Dinh

[57] ABSTRACT

An amplifier has a first stage employing a pair of differentially connected NMOS amplifier transistors, a second stage composed of a bipolar current mirror circuit and two charge pumps. Each charge pump may be a switching voltage multiplier circuit without the conventional output capacitor. The outputs of the two charge pumps are connected, respectively, to the collector of the current-mirror output transistor and to the commonly connected sources of the NMOS amplifier transistors. Each charge pump serves as both a pulse-voltage energizing source and a load to the amplifier. The amplifier is incorporated with a high-current NMOS transistor in an integrated circuit, wherein one differential input of the amplifier is connected to the source of the driver transistor at which an external load, e.g. a motor, may be connected. The output (collector) of the differential amplifier is connected to the gate of the NMOS driver transistor so that the load current through the driver transistor is held regulated to a value proportional to the input or reference voltage that is applied to the other input of the differential amplifier. The peak pulse voltage of each charge pump is greater than the DC supply voltage from which the driver transistor and the two charge pumps are energized so that the dynamic range of both the input control voltage and the amplifier output to the gate of the NMOS driver transistor is much greater than the DC supply voltage to the integrated circuit.

13 Claims, 2 Drawing Sheets

WIDE-DYNAMIC-RANGE AMPLIFIER WITH A CHARGE-PUMP LOAD AND ENERGIZING CIRCUIT

BACKGROUND OF THE INVENTION

This invention relates to electronic signal amplifiers and more particularly to such an amplifier wherein a charge pump serves as the load and source of operating energy.

There is shown in FIG. 1 a typical prior art driver circuit in which an NMOS high-side driver transistor 10 controls the current through a load 12 that is connected to the source of the driver transistor 10. The driver 10 and driver load 12 are connected between a voltage energizing terminal 14, at which a positive voltage Vcc may be applied, and a circuit ground point 16. A differential amplifier 18, having a load resistor 19, is connected in a feedback loop between the source and the gate of the driver transistor 10 for establishing a current in the driver load 12, which driver load current is proportional to the input voltage of the feedback amplifier 18 at input terminal 20.

This driver circuit illustrates a problem in prior art circuits wherein it is desired to energize a high current driver transistor from a voltage source (Vcc) capable of supplying the necessary high currents to the load, while at the same time it may be desirable to energize relatively low-power driver-control circuits, such as the amplifier 18 in FIG. 1, from a source of voltage that is much greater than Vcc in order to provide a greater dynamic range of input and output driver-control signals.

This problem is typically solved by providing a second energizing voltage source (not shown) for supplying separately the needed higher voltage to the driver control circuits. The considerable additional expense of providing the second and higher voltage supply source is often avoided leading to compromises in amplifier performance, and therefore driver circuit performance. This additional expense is especially objectionable when the driver transistor and the driver control circuits are to be integrated in a single silicon chip.

It is an object of this invention to provide an amplifier circuit capable of having a greater dynamic range of input and output signals than the magnitude of the supply voltage that is used to energize the amplifier.

It is a further object of this invention to provide such an amplifier as a driver-control-signal amplifier in a low cost integrated circuit wherein both the wide dynamic range amplifier and the driver may both be energized from the same voltage source.

Summary of the Invention

A generic "transistor" to be described herein includes bipolar and field effect transistors (FET's). Such a generic transistor is said to have a control terminal, a high-impedance output terminal and a low-impedance output terminal. These three terms as used herein are to be defined as follows. When the transistor is a FET, the control terminal is the gate, the high-impedance output terminal is the drain and the low-impedance terminal is the source. When the transistor is a bipolar transistor these three terms are respectively the base, collector and emitter.

An amplifier circuit to be described herein will be said to have a high impedance output when it is taken either as a collector or a drain of an output transistor. Likewise the amplifier will be said to have a low-impedance output when it is taken from an emitter or a FET source.

A linear amplifier circuit of this invention includes a final stage with a high-impedance output, a charge pump having a high output impedance connected to the amplifier output, and an oscillator for producing signal pulses, preferably at a constant frequency. The charge pump is connected to the DC voltage supply conductor for being energized therefrom, and has an input connected to the oscillator for being switched thereby.

The charge pump is for producing at the output under open circuit conditions, voltage pulses at the frequency of the oscillator, which voltage pulses have peak values substantially greater than a DC voltage that may be applied to the DC voltage supply conductor. The output of the charge pump is connected to one of the high-impedance output terminals of the amplifier transistor whereby the substantial source impedance of the charge pump serves as the load and the voltage pulses of the charge pump serve as an energy source to the linear amplifier. The charge pump thus operates approximately as a pulsed current source, the substantial source impedance thereof being at least commensurate with or much greater than the source impedance of the amplifier transistor to which it is connected.

By another measure, the substantial source impedance of the charge pump is preferably large enough that the voltage drop across it, due to current flowing through the output of the charge pump, reduces the peak voltage at that output by more than 50 percent relative to the peak magnitude of the voltage pulses.

Linear amplifiers of this invention may include bipolar or FET amplifier transistors or both and may include a charge pump connected in the output of the last amplifier stage or in the first stage or both. Linear amplifiers of this invention are capable of being energized by a DC supply voltage while providing a greater dynamic input and output voltage range that greatly exceeds the supply voltage, and may therefore advantageously be incorporated in an integrated circuit or used in a system wherein other circuits are included that require a low-voltage high-current DC supply which is suitable for also powering this high resilience amplifier. Furthermore, voltage multiplier and charge pump stages typically include small value capacitors of noncritical value that can readily be provided within an integrated circuit.

The linear amplifier of this invention is particularly well suited for use in an integrated driver circuit. The driver transistor, e.g. a power MOSFET, has a control terminal, e.g. the gate, connected to the output of the linear amplifier; has one high-impedance output terminal, e.g. the drain, connected to the same DC voltage supply conductor that also is the source of energy for the charge pump; and has another but low-impedance output terminal, e.g. the source, connected to the integrated-circuit chip driver-output pad to which an external load, e.g. a motor, may be connected. An input of the amplifier is connected to the driver-output pad to which an external load may be connected, and the high-impedance output of the amplifier is connected to the input terminal of the driver transistor.

In the integrated driver circuit it is preferred that the amplifier is a differential amplifier having a second input to which a reference of control signal voltage may be applied, so that the load current in the driver will be proportional to the control voltage. Thus an integrated closed-loop regulated driver is provided wherein the amplifier output signal to the driver transistor may have a voltage range much greater than the amplitude of the DC supply voltage to the integrated circuit.

When the driver transistor is a power MOSFET, the bandwidth of the amplifier is controlled by MOSFET gate capacitance and the charge pump source resistance. The gate capacitance is also the charge pump load filter. Good regulation is achieved by choosing the charge pump clock rate to be much larger than the loop bandwidth.

Additional dynamic range in the regulating feedback amplifier by additionally powering the amplifier with a second charge pump energized from the same voltage supply pad and connected to a low-impedance output of the first stage in the linear amplifier, thereby additionally permitting a much greater effective swing in amplifier input control voltage as well. Furthermore the linear amplifier is now a dynamic amplifier, having gain only at the moments when a voltage (and thus a current) pulse is being generated in the second charge pump. When the two charge pumps are clocked by the same on-board oscillator or are otherwise synchronized, the simultaneous currents from the first charge pump and from the output of the linear amplifier that meet at the driver input terminal help to reduce the clock "noise" there. The linear amplifier with the two charge pumps requires little integrated circuit chip area, does not require the use of external discrete components and provides good regulated-driver performance at relatively low cost.

DESCRIPTION OF THE PREFERRED EMBODIMENTS

Figure 2:
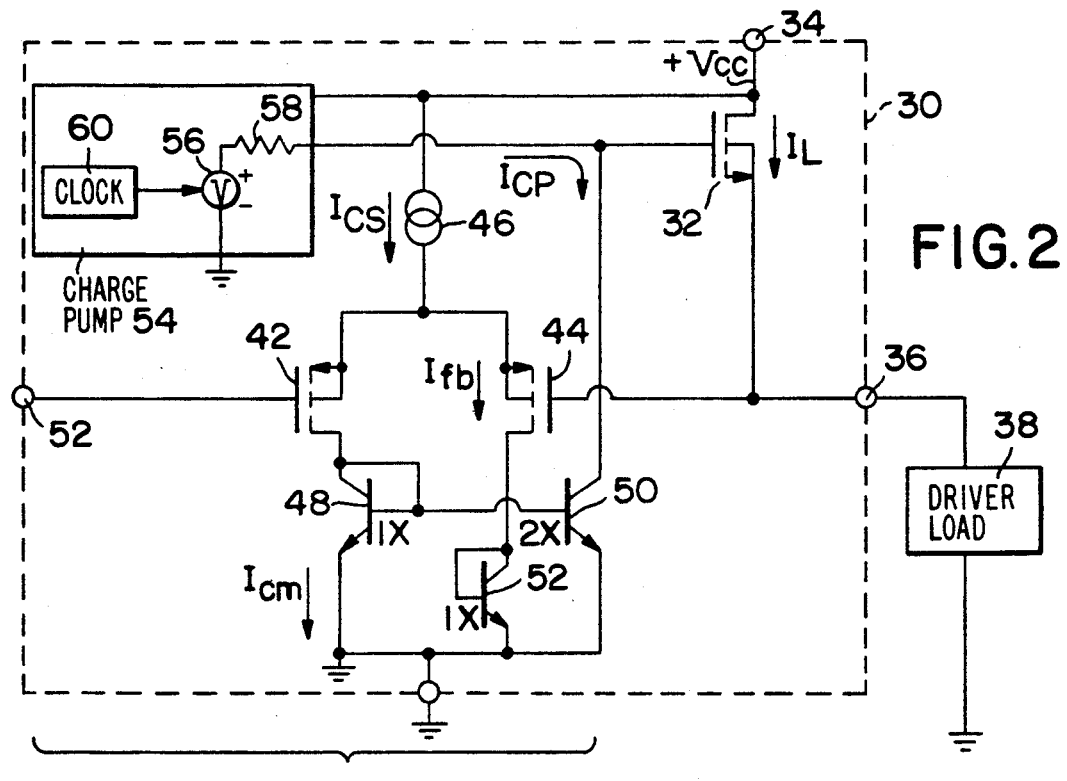
FIG. 2 shows a first regulating driver circuit of this invention including a feedback amplifier with a charge-pump load and energizing circuit.

Referring to FIG. 2, a silicon integrated circuit 30 includes an NMOS driver transistor 32 connected drain to source between the voltage supply terminal 34 and the output terminal 36 to which a load 38, e.g. a motor, is connected. An amplifier 40 has a pair of differentially connected NMOS transistors 42 and 44 having their sources connected via the current source 46 to the voltage supply terminal 34 at which a voltage +Vcc is to be applied. The amplifier 40 additionally includes a current mirror circuit composed of an input-branch NPN transistor 48 and an output-branch NPN transistor 50. The NPN transistor 48 is connected to the drain of the differential amplifying NMOS transistor 42 and a diode connected NPN transistor 52 is connected for amplifier balance to the drain of the other differential amplifying NMOS transistor 50. The driver load current $I_L$ will be proportional to the input voltage applied to the input terminal 52.

The amplifier 40 has a load consisting of a charge pump 54 connected between the collector of the NPN transistor 50 and the voltage supply terminal 34. The charge pump 54 is shown having a Thevenin-equivalent voltage source 56 and a Thevenin-equivalent source resistance 58, a free-running oscillator or pulse generator 60 connected to the voltage source 56 to produce current pulses Icp of the clock frequency, fc, through the NPN current mirror circuit stage of amplifier 40. The magnitude of the charge-pump load current Icp is twice the magnitude of current Icm since the base-emitter junction area (1×) of the transistor 50 is (2×) twice that of the transistor 48. The sum of Icm and Ifb always equals the current source current Ics.

Figure 3:
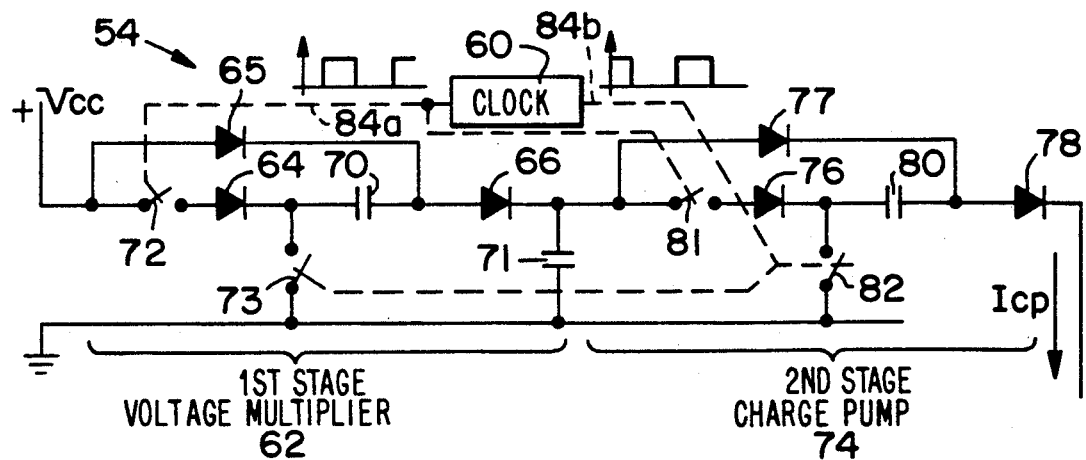
FIG. 3 shows a circuit diagram of a charge pump employed in the driver circuits of FIG. 2 and FIG. 4.

Referring to FIG. 3, a charge pump circuit is shown corresponding to the equivalent-circuit 54 in FIG. 2. The charge-pump circuit has two stages. The first stage 62 is a standard voltage multiplier circuit, e.g. as described (FIG. 10.23(b) at page 517) in the text book entitled "Bipolar and MOS Analog Integrated Circuit Design" by Alan B Grebene, 1984, John Wiley & Sons; pages 514–517. It includes the three diodes 64, 65, and 67, the two capacitors 70 and 71, and the two clock-actuated switches 72 and 73. The voltage across the output capacitor 71 has a peak value of nearly twice the input voltage Vcc.

Still referring to FIG. 3, the second stage 74 serves as a charge pump stage and includes three diodes 76, 77 and 78, one capacitor 80, and two clock-actuated switches 81 and 82. In general, charge pump 54 may consist of only one stage, namely the charge pump second stage 74; or additional voltage multiplier stages may be included for obtaining even a higher source voltage.

The clock output 84a consists of periodic voltage pulses of frequency f. When the output voltage at clock output 84a is high the switches 72 and 81 are closed, while at the same time the complementary output voltage at clock output 84b is low keeping switches 81 and 82 open. Switches 72 and 81 are off when switches 73 and 83 are on, and visa versa. The switches 72, 73, 81 and 82 are preferably transistor switches.

Figure 1:
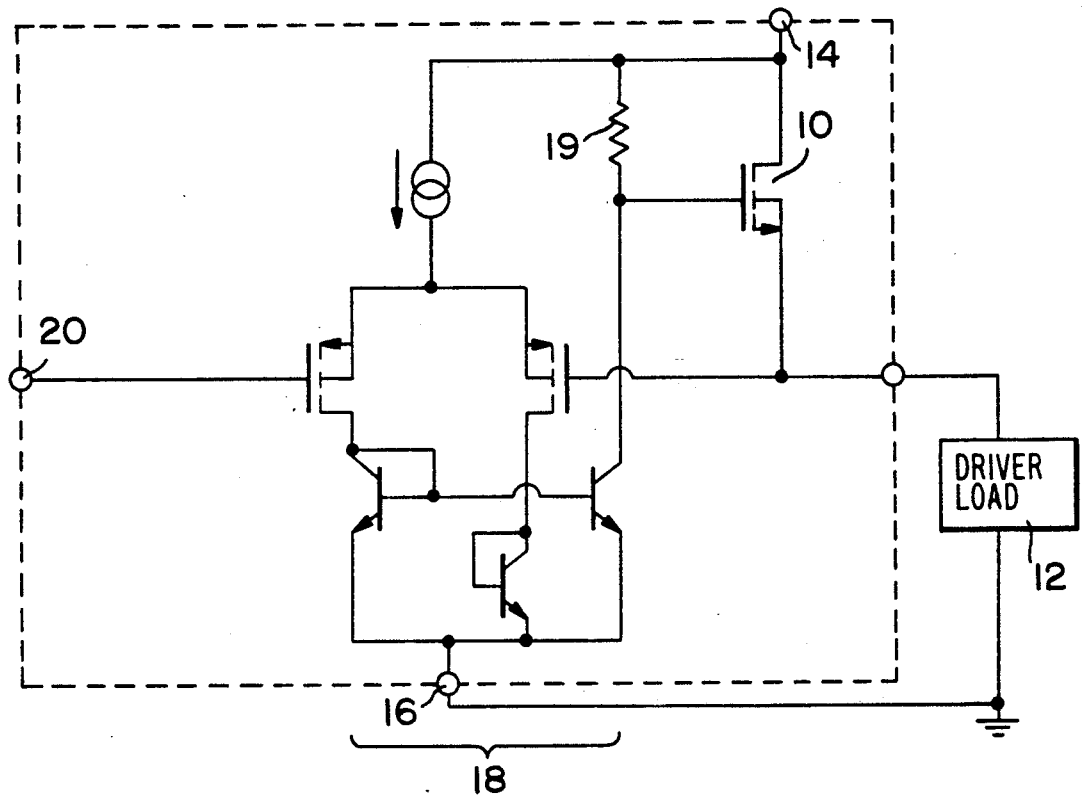
FIG. 1 shows a prior art driver circuit providing an output current that is regulated with respect to the input voltage.

The voltage across the capacitor 71 of stage 62 is a positive DC voltage usually with a relatively small amount of ripple superimposed on it. If the ripple is assumed to be negligible, the input voltage to the second charge pump stage 74 can be assumed to be 2Vcc, and the Thevenin equivalent voltage of the second stage 74 becomes approximately 4Vcc looking back into the output (cathode of diode 78) of stage 74. That Thevenin voltage source 56 is depicted in FIG. 2, the equivalent voltage therefrom having the form of voltage pulses (about 4Vcc peak) of clock frequency f. The source impedance of the charge pump, or a Thevenin equivalent source resistance is Req=1/f.Cs. The average output current is Icp(av.)=4Vcc/Icp(av.). Cs is any capacitance added (not shown) to the driver circuit that tends to load but smooth the charge pump output current Icp. For example, physically large NMOS driver transistor 10 (FIG. 1) will have a large on-board gate capacitance. This gate capacitance will also provide a significant smoothing of the charge pump current Icp and thus will smooth the driver gate voltage and driver load current through load 38.

In addition to serving as the charge pump filter, the driver gate capacitance Cs in conjunction with the charge pump resistance Req determine the bandwidth of the amplifier 40 and thus the feedback loop. Good regulation of the driver load current $I_L$ through load 38 is achieved by choosing the charge pump clock rate to be much larger than the loop bandwidth.

Figure 4:
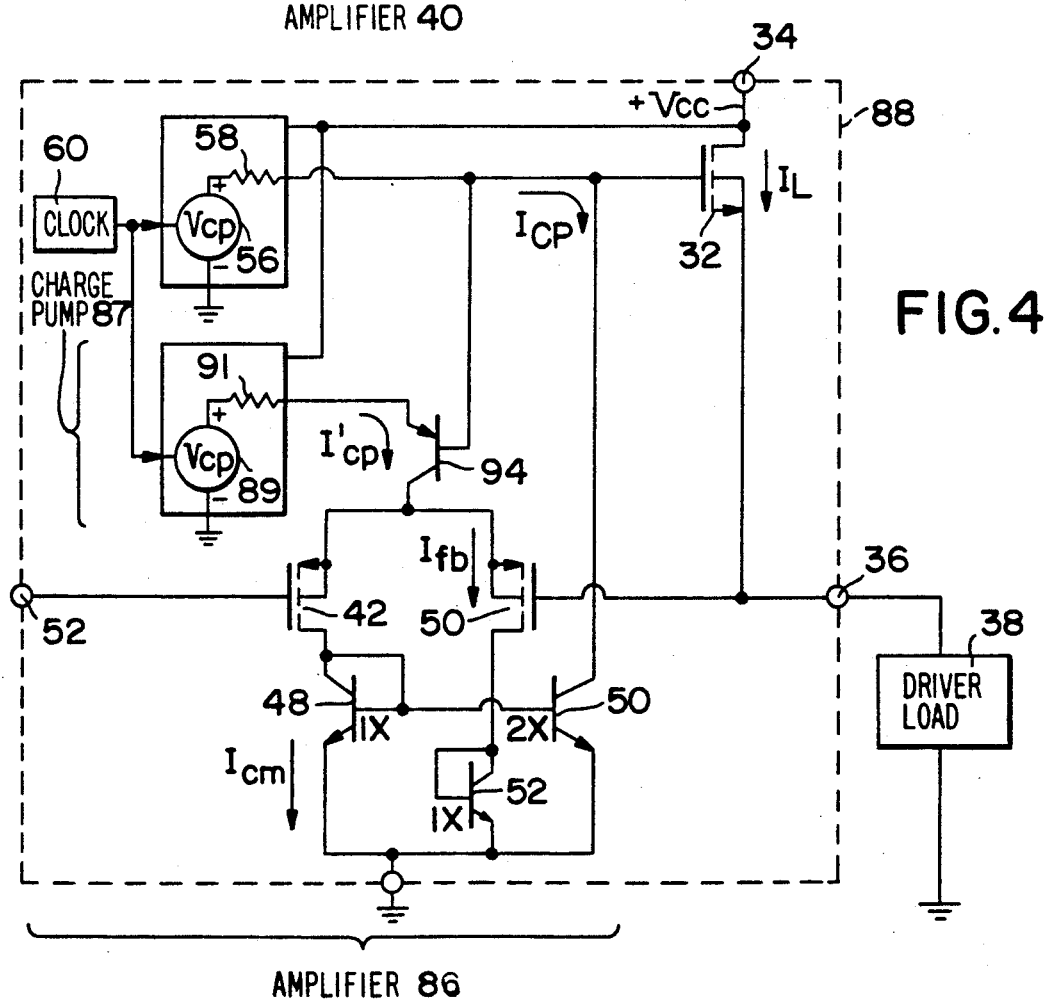
FIG. 4 shows a second regulating driver circuit of this invention including a feedback amplifier with two charge pumps that each constitute amplifier loads and energizing sources.

In the second and most preferred embodiment of this invention as shown in FIG. 4, additional dynamic range of the feedback amplifier 86 may be obtained by energizing the differential NMOS stage (comprised of NMOS transistors 42 and 44) with a second charge pump 87 as is depicted in the integrated circuit chip 88 of FIG. 4.

The charge pump 87 may be identical to the first charge pump 54, e.g. that of FIG. 3 in the driver circuit FIG. 2, except that the insignificant stray capacitance at the output of the second charge pump 87 will have essentially no smoothing effect. In this case, the Thevenin equivalent voltage 89 of charge pump 87 will also be about 4Vcc but since the stray capacitance Cs will be small the Thevenin source resistance 91 will be much larger than that of equivalent resistance 58 leading to good common-mode rejection of the "clock" noise from the charge pumps.

Consequently, in view of the larger source resistance 91 in charge pump 87, a larger common-mode rejection of those common-mode pulses is provided in amplifier 86 (than in amplifier 40 of FIG. 2).

The charge pump 87 may have its output directly connected to the sources of the differential pair of NMOS transistors 42 and 44, but it is preferred to make that connection through the PNP transistor 94 having its base connected to the gate of the NMOS driver transistor 32. In this way the PNP transistor provides even a higher source impedance and thus amplifier 86 has even a greater common-mode rejection. The amplifier 86 which sinks the first charge-pump current Icp now has gain only at the switching instant when a pulse of charge-pump current Icp' from the second charge pump 87 is present. Also, the charge pumps 54 and 87 preferably share the same clock 60 as shown in FIG. 4.

The use of a separate charge pump 87 for energizing the differential amplifying transistors, the employment of the PNP transistor 94 for making that connection and the synchronous clocking of the two charge pumps, although not essential, are all contributors to reduction of "clock" noise appearing at the gate of the NMOS driver transistor 32.

What is claimed is:
1. A linear voltage amplifier circuit comprising:
a DC voltage supply conductor;
a final amplifier stage having a high impedance-output;
an oscillator for producing signal pulses;
a charge pump circuit means connected to said DC voltage supply conductor for being energized therefrom, having an input connected to said oscillator, and having an output with a substantial source impedance,
for producing, at said charge-pump-means output under open circuit conditions, voltage pulses at the frequency of said oscillator signal pulses, said voltage pulses having peak values substantially greater than the voltage applied to said DC voltage supply conductor, said high impedance-output of said final amplifier stage being connected to said charge-pump-means output, said substantial source impedance of said output of said charge pump circuit means serving as a load to said final-amplifier-stage transistor and the high voltage pulses of said charge-pump means serving as a high voltage energizing source to said amplifier transistor.

2. The amplifier of claim 1 wherein said oscillator is a free-running type oscillator for operating at a fixed frequency.

3. The amplifier of claim 1 wherein said charge-pump means consists of diodes, capacitors, and switches for being actuated by said oscillator signal pulses.

4. The amplifier of claim 1 wherein said charge-pump means is a standard voltage multiplier circuit without the output capacitor.

5. The amplifier of claim 1 wherein said substantial source impedance of said charge-pump-means output is large enough that the voltage drop across it due to current flowing through said charge-pump-means output reduces the peak voltage at the charge-pump-means output by more than 50 percent so that the charge-pump means operates approximately as a pulse-current source.

6. An integrated driver circuit of the kind formed in a silicon chip that includes (a) a driver transistor having a control terminal and two output terminals; (b) a supply voltage pad to which one of said driver-transistor output terminals is connected; (c) a driver-circuit output pad to which the other of said driver-transistor output terminals is connected and to which an external driver load may be connected; and (d) a linear amplifier means having one input connected to said driver circuit output pad and including one high-impedance output connected to said driver-transistor input terminal, for regulating the voltage at said driver-circuit output pad, wherein the improvement comprises:
one charge pump circuit means connected to said supply voltage pad for receiving excitation therefrom and having a high-impedance output connected to said one output of said amplifier means for providing an energizing voltage and load impedance to said one output of said amplifier means, said linear amplifier means being additionally for sinking the output current from said one charge pump means, said energizing voltage of said one charge pump means being a series of voltage pulses having a peak amplitude that is substantially greater than a DC supply voltage that may be externally applied to said supply voltage pad.

7. The integrated driver circuit of claim 6 wherein said driver transistor is a field effect transistor.

8. The integrated driver circuit of claim 6 wherein said linear amplifier means includes a differential-amplifier stage with two inputs, one of said two inputs corresponding to said one input connected to said driver circuit output pad, so that the load current in said driver transistor will be regulated with respect to a voltage that may be applied to the other of said two inputs of said differential amplifier stage.

9. The integrated driver circuit of claim 8 wherein said differential-amplifier stage includes a pair of differentially connected field effect transistors, the gates of said pair of transistors corresponding to said two inputs, respectively; said driver circuit additionally comprising a standard current source connected between said voltage supply pad and the sources of said differentially connected field effect transistors.

10. The integrated driver circuit of claim 8 wherein said one output of said linear amplifier-means has a source-impedance which is commensurate with the source impedance of said one charge-pump-means output, said linear amplifier means including another output having a low-impedance, and said driver circuit additionally comprising a second charge pump means connected to said supply voltage pad for receiving excitation therefrom and having an output connected to said another output of said linear amplifier means for providing energizing voltage pulses and a high-impedance load to said another output of said amplifier means.

11. The integrated driver circuit of claim 10 wherein said differential-amplifier stage is the first linear-amplifier stage, said two differentially connected field effect transistors having their sources connected to the circuit point corresponding to said another low-impedance output of said linear amplifier means.

12. The integrated driver circuit of claim 10 additionally comprising an oscillator having an output connected to said one and to a second charge pump means for synchronously clocking said charge pump means.

13. The integrated driver circuit of claim 10 additionally comprising a synchronizing transistor means through which said output of said second charge pump means is connected to said another output of said linear amplifier means; said synchronizing transistor having means being further connected to said output of said one pulsing charge pump means for effecting connection between said second charge pump means and said linear amplifier means only during periods when there exists one of said pulses in said one charge pump means.

* * * * *